US007999340B2

(12) United States Patent
Rossi et al.

(10) Patent No.: US 7,999,340 B2
(45) Date of Patent: Aug. 16, 2011

(54) APPARATUS AND METHOD FOR FORMING OPTICAL BLACK PIXELS WITH UNIFORMLY LOW DARK CURRENT

(75) Inventors: Giuseppe Rossi, Los Angeles, CA (US); Lester Kozlowski, Simi Valley, CA (US); Henry Lin, San Jose, CA (US); John Richardson, Newbury Park, CA (US); Gregory Chow, Camarillo, CA (US); Gaurang Patel, Newbury Park, CA (US)

(73) Assignee: AltaSens, Inc., Westlake Village, CA (US)

( * ) Notice: Subject to any disclaimer, the term of this patent is extended or adjusted under 35 U.S.C. 154(b) by 394 days.

(21) Appl. No.: 11/715,799

(22) Filed: Mar. 7, 2007

(65) Prior Publication Data
US 2008/0217712 A1  Sep. 11, 2008

(51) Int. Cl.
*H01L 31/232* (2006.01)

(52) U.S. Cl. ........ 257/431; 257/184; 257/187; 257/259; 257/292; 257/461; 257/222; 257/432; 257/443; 257/455; 257/463; 257/466; 257/E31.119; 257/E31.127; 257/E25.005; 438/39; 438/81; 438/164

(58) Field of Classification Search .................. 257/184, 257/187, 259, 292, 461, 222, 432, 443, 431, 257/44, 433, 455, 463, 462, 466, E31.119, 257/E31.127, E25.005; 438/39, 81, 164
See application file for complete search history.

(56) References Cited

U.S. PATENT DOCUMENTS

| | | | |
|---|---|---|---|
| 3,603,731 A | 9/1971 | Weimer | |
| 3,822,362 A | 7/1974 | Weckler et al. | |
| 4,387,402 A | 6/1983 | Lewis | |
| 4,412,343 A | 10/1983 | Kosonocky | |
| 4,602,291 A | 7/1986 | Temes | |
| 4,678,938 A | 7/1987 | Nakamura | |
| 4,819,071 A | 4/1989 | Nakamura | |
| 4,839,729 A | 6/1989 | Ando et al. | |
| 4,914,519 A | 4/1990 | Hashimoto et al. | |
| 4,984,085 A | 1/1991 | Landowski | |
| 5,408,314 A | 4/1995 | Perry et al. | |
| 5,408,335 A | 4/1995 | Takahashi et al. | |
| 6,750,910 B1 | 6/2004 | Bilhan | |
| 7,098,950 B2 | 8/2006 | Yamamoto et al. | |
| 7,139,028 B2 * | 11/2006 | Itano et al. | |
| 7,445,947 B2 * | 11/2008 | Inuiya | 438/22 |
| 7,459,735 B2 * | 12/2008 | Ezaki et al. | 257/292 |
| 2003/0103150 A1 * | 6/2003 | Catrysse et al. | |
| 2005/0067554 A1 * | 3/2005 | Rhu | |
| 2005/0167710 A1 * | 8/2005 | Kozuka et al. | 257/292 |
| 2006/0214195 A1 * | 9/2006 | Kobayashi et al. | 257/222 |
| 2006/0237692 A1 * | 10/2006 | Oda | |
| 2007/0120214 A1 * | 5/2007 | Cole | 257/461 |

OTHER PUBLICATIONS

PCT International Search Report.*

(Continued)

*Primary Examiner* — Marcos D Pizarro
*Assistant Examiner* — Marc Armand
(74) *Attorney, Agent, or Firm* — Reed Smith LLP

(57) ABSTRACT

An apparatus and method for forming optical black pixels having uniformly low dark current. Optical Black opacity is increased without having to increase Ti/TiN layer thickness. A hybrid approach is utilized combining a Ti/TiN OB layer in conjunction with in-pixel metal stubs that further occlude the focal radius of each pixel's incoming light beam. Additional metal layers can be used to increase the opacity into the infrared region.

7 Claims, 5 Drawing Sheets

OTHER PUBLICATIONS

M. Pines, et al., "Characteristics of Gallium-Doped Silicon Infrared Detectors," IEDM 1975, pp. 502-505.

D.F. Barbe, "Advanced Infrared Focal Plane Array Concepts," Electro-Optical Systems Design, Apr. 1977, pp 50-57.

* cited by examiner

APPARATUS AND METHOD FOR FORMING OPTICAL BLACK PIXELS WITH UNIFORMLY LOW DARK CURRENT

BACKGROUND OF THE INVENTION

1. Field of the Invention

The present invention relates generally to image processing for electronic imaging sensors, and more particularly, to an apparatus and method for forming reference pixels in an image sensor such that they behave like imaging pixels, but are insensitive to light, while exhibiting similar dark current characteristics.

2. Description of the Related Art

Optical black pixels ("OB pixels") are the reference pixels within an imaging sensor pixel array that have virtually identical electrical characteristics as a standard active pixel, yet are insensitive to light. OB pixels are used by various image processing circuits in the sensor or camera to maintain a constant black level independent of gain, illumination, changes in sensor operating conditions, etc. An OB pixel's signal is normally processed using the same signal chain and timing as those that are photo-electrically responsive and form the image of interest. The latter pixels, which constitute the majority of pixels in an imaging sensor, are some times referred to as "Clear Pixels." While the clear pixels form the image, the OB pixels are only indirectly used in the image formation process.

In an imaging System-on-Chip (iSOC) system, OB pixels are typically used as reference pixels for many calibration operations aimed at enhancing image quality. These include black clamp stabilization, fixed pattern noise suppression and line noise correction. In these and other algorithms, OB pixels must have the identical dark signal response as a clear pixel; they must mimic the response that a clear pixel would have if it were imaging a scene characterized by absence of any light so that the sensor's dark response is accurately set.

Different applications of an imaging sensor pixel array may require differing degrees of image quality. For instance, a CMOS sensor studio broadcast camera used to generated content for HDTV broadcasting (high end application) requires a significantly higher image quality than a CMOS sensor used in a camcorder for consumer applications (medium to low end application). This involves not only better clear pixel quality, but also better quality of optical black. Therefore, the most important property of an OB pixel is how closely it truly represents the dark signal response of a clear pixel under any possible lighting condition of the pixel array. For instance, high end applications require an OB pixel to have significantly higher fidelity under extreme conditions, e.g., higher end applications require OB pixels to maintain a higher degree of opacity than for consumer applications without degrading electrical characteristics.

Early methods for capably reading clear and optically black pixels in MOS sensor arrays are taught in U.S. Pat. Nos. 3,603,731 and 3,822,362. The '362 patent specifically uses design symmetry to eliminate common switching noise in all pixels and, hence, generates a reference signal that mimics and effectively improves the clear signal.

U.S. Pat. No. 4,387,402 discloses the addition of an optically opaque row of detectors in a Charge Injection Device to enhance clear signal quality by differencing the signal voltage between the clear and OB pixels using correlated double sampling. In addition, the OB pixels constitute a reference voltage, or black level, for each column. Nevertheless, those skilled in the art appreciate that the OB pixels are not sufficiently opaque; off-axis light rays will penetrate the overlying metal layer and degrade efficacy.

Kosonocky in U.S. Pat. No. 4,412,343 instead estimates the dark current generated during the integration epoch and teaches means for subtracting the estimate from the total signal. However, no means for accurately determining the OB signal is presented. U.S. Pat. No. 4,602,291 (Temes et al.,) and U.S. Pat. No. 4,819,071 (Nakamura et al.,) also provide circuit means for removing the offset pedestal, but no method for optimally forming the OB pixels. Subsequently, in U.S. Pat. No. 4,678,938 Nakamura also teaches the benefit of OB pixels and the necessity for inclusion along the periphery of the imaging sensor, but no means for forming the OB pixels apart from covering them with a "light shield."

In U.S. Pat. No. 4,839,729, Ando addresses the challenge of providing a high quality dark reference by reading the dark signals out of a row of light-receiving cells and storing them in a dark signal memory. Unfortunately, it is practically impossible to have sufficiently short integration time to preclude some light pollution in the read cells.

U.S. Pat. No. 4,914,519 further ignores the critical need for forming optimal OB pixels by instead supplying a reference signal that cannot be corrupted by light. While the reference can remove some of the column-related fixed pattern noise and a facsimile of the dark current estimate for the integration epoch, the final image quality is again inadequate since only estimates are used rather than accurate calculations and the reference signal does not change appropriately with sensor operating conditions including temperature. Additional U.S. Pat. Nos. 4,984,085, 5,408,314, 5,408,335, 6,750,910 and 7,098,950 provide alternative circuits for performing the reference subtraction, but no specific solution is disclosed for producing the ideal reference that is best achieved by using properly formed OB pixels.

SUMMARY OF THE INVENTION

In general, the present invention provides an apparatus and method for forming optical black pixels having uniformly low dark current. Optical Black opacity is increased without having to increase Ti/TiN layer thickness. A hybrid approach is utilized combining a Ti/TiN OB layer in conjunction with in-pixel metal stubs that further occlude the focal radius of each pixel's incoming light beam. Additional metal layers can be used to increase the opacity into the infrared region.

According to one embodiment, the present invention may comprise an optical black pixel having a photodiode, a metal layer overlaying the photodiode, and a Ti/TiN layer overlaying the metal layer. The metal layer may comprise a metal stub formed in a top inter-level metal layer. The metal stub is preferably smaller than a full pixel area. The pixel may further comprise a microlens covering the pixel.

In a preferred embodiment, the Ti/TiN layer is approximately 1000 Å thick. In addition, at least one additional metal stub may be formed at a different metal layer to increase the pixel's opacity in the infrared region.

A method of increasing the opacity in an optical black pixel includes forming a metal stub in an inter-level metal, the metal stub covering an area of a photodiode in the pixel, and forming a Ti/TiN layer above the metal stub.

An image sensor incorporating the present invention may comprise an array of clear pixels, and a plurality of optical black pixels, the optical black pixels having a metal stub in an inter-level metal, the metal stub covering an area of a photodiode in the pixel, and a Ti/TiN layer formed above the metal stub. In a preferred embodiment, the Ti/TiN layer is approximately 1000 Å thick.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The following description is provided to enable any person skilled in the art to make and use the invention and sets forth the best modes contemplated by the inventor for carrying out the invention. Various modifications, however, will remain readily apparent to those skilled in the art. Any and all such modifications, equivalents and alternatives are intended to fall within the spirit and scope of the present invention.

In general, the present invention provides Optical Black (OB) reference pixels having nearly identical electrical characteristics as the clear pixels in the imaging sensor. The OB reference pixels are free of the impediments of existing techniques that complicate sensor design and production. Existing techniques generally require significant changes to process technologies and these deviations are incompatible with standard wafer production. According to an embodiment of the present invention, image sensor electrical performance is unaffected by the additional processing needed to optimally form OB pixels, apply color filters, form microlenses, and apply a protecting layer over the surface of the sensor.

Figure 1:
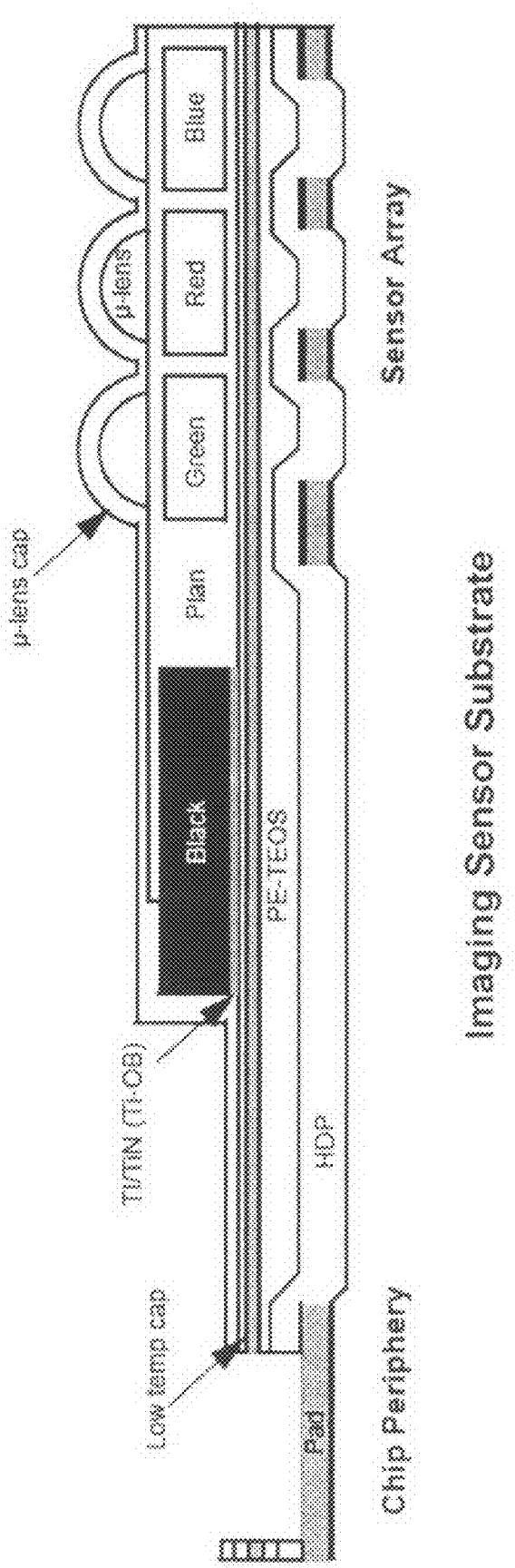
FIG. 1 is a diagram illustrating Ti/TiN Optical Black pixel structure.

An improved method for forming an Optical Black layer separately from the underlying CMOS sensor process is disclosed in U.S. Pat. No. 7,547,573 entitled IMAGE SENSOR AND METHOD FOR MANUFACTURING THE SAME, filed Aug. 1, 2006, the disclosure of which is herein incorporated by reference in its entirety. This patent describes a method of forming the Optical Black layer by depositing a Ti/TiN layer over the top of the sensor passivation surface and immediately below the Color Filter Planarization layer (see FIG. 1). The thickness of the metal mask used for OB formation to render the OB pixel opaque is adjustable to increase opacity and decrease light transmission into the OB pixel. By depositing the Ti/TiN layer over the sensor after the bulk of the critical steps are completed, pixel performance is separately optimized from OB performance. In other words, pixel performance is optimized separately from the steps needed to optimize the properties of the optical black, color filters and microlenses.

Figure 2:
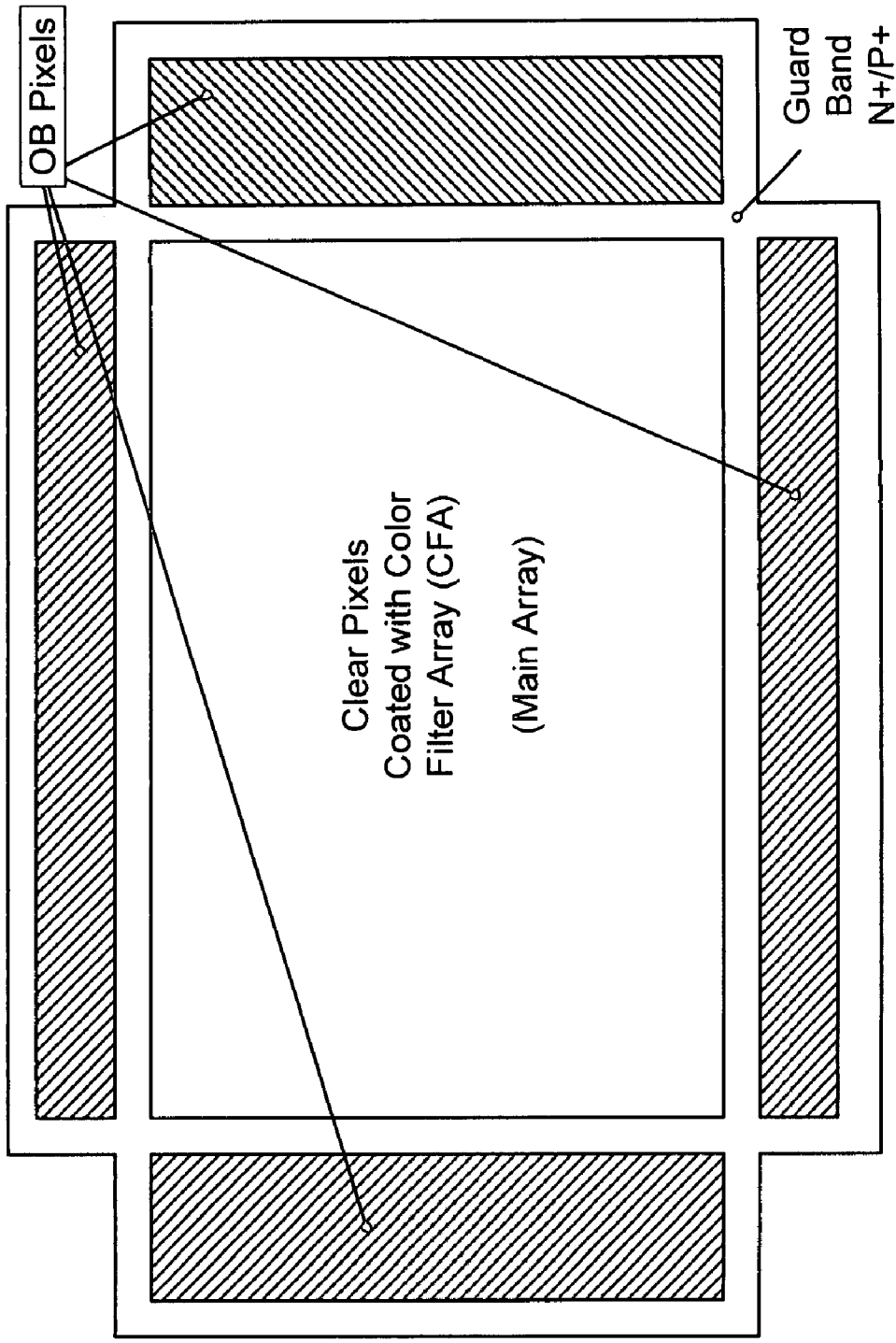
FIG. 2 is a diagram of a pixel array format, wherein the pixel array is divided into a main image sensor array of Clear Pixels, and three smaller pixel arrays of Optical Black pixels, divided by guard bands.

In addition to the separately formed Ti/TiN layer, the pixel array of U.S. Pat. No. 7,547,573 is segmented into isolated blocks, as illustrated in FIG. 2. The three primary blocks included:
1. a physically isolated Clear Pixel array
2. an OB array
3. a dummy array that separates the clear pixel and OB regions.

Figure 3:
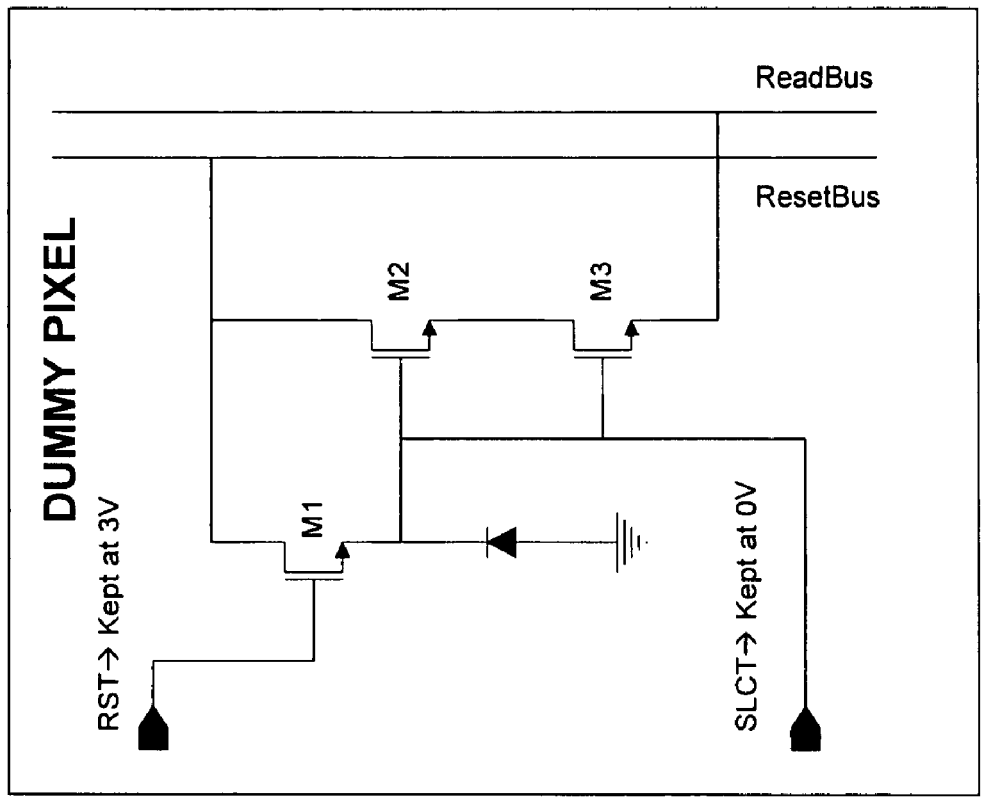
FIG. 3A is a schematic of a standard Clear Pixel.
FIG. 3B is schematic of a standard Dummy Pixel.
Figure 3:
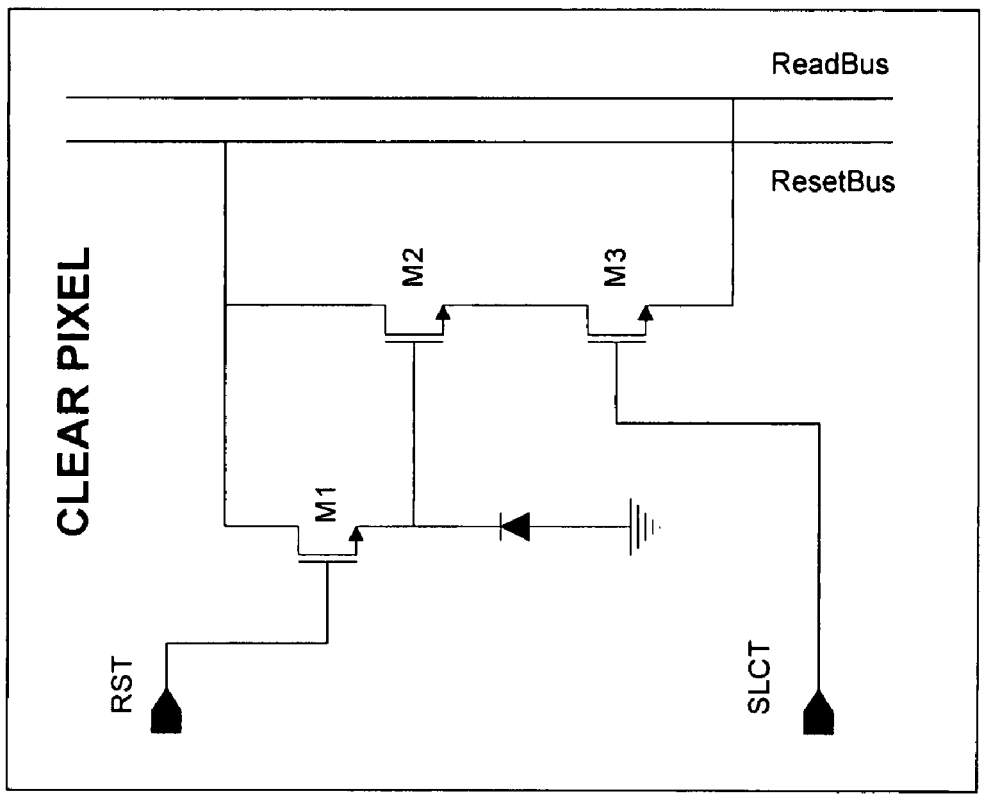

The dummy array of FIG. 2 is the physical space between the clear pixel array and the OB array. It consists of a combination of N-type and P-type guard bands that are each about 40 to 60 pixels wide. The configuration of these dummy pixels is shown in FIG. 3. According to this scheme, each pixel photodiode is kept at 0V potential by physically connecting the Select signal (SLCT) to the photodiode diffusion and imposing the condition, for dummy pixels, that the SLCT signal be held at 0V. Such a bias condition for each dummy photodiode corresponds to full well saturation and is therefore unfavorable for attracting minority carriers in a p-type substrate (electron). Consequently, while the guard band can capture stray photo-generated signals in the underlying bulk, it can not minimize dark current accumulation in the neighboring pixels. Also, due to the block segmentation, microlenses can only be deposited on the clear pixel array.

According to the present invention, the major region of the Optical Black layer is formed separately from the underlying CMOS sensor process by depositing a Ti/TiN layer over the sensor as disclosed in U.S. Pat. No. 7,547,573.

However, the present invention uses a continuous pixel array structure rather than the segmented structure described in U.S. Pat. No. 7,547,573. All pixels, including clear, OB and dummy share the same design in a contiguous, waffle array. Producing a pixel as a clear pixel, OB pixel or dummy pixel is determined by the routing process implemented in the metallization layers (i.e., the back-end-of-line, or BEOL). This configuration has the advantage that it provides a very isotropic environment in which any pixel within the pixel array can not distinguish itself from its neighbors. Other advantages stemming from the relatively uniform density of BEOL interconnections across the entire pixel array include improved wafer planarity, improved Chemical Mechanical Polishing (CMP) and more uniform pixel processing. The uniform waffle construction results in significantly more uniform behavior of all pixels within the pixel array.

Another advantage of the improvement relative to the prior art is that all pixels can be covered by a microlens array. In the segmented pixel array of the prior art, conventional processes have not allowed multiple non-adjacent arrays of micro-lens; this limited micro-lens integration to only the main Clear pixel array. By now enabling microlenses in the OB area, OB performance is significantly improved in conjunction with the addition of segmented metallization, as described below.

Figure 4:
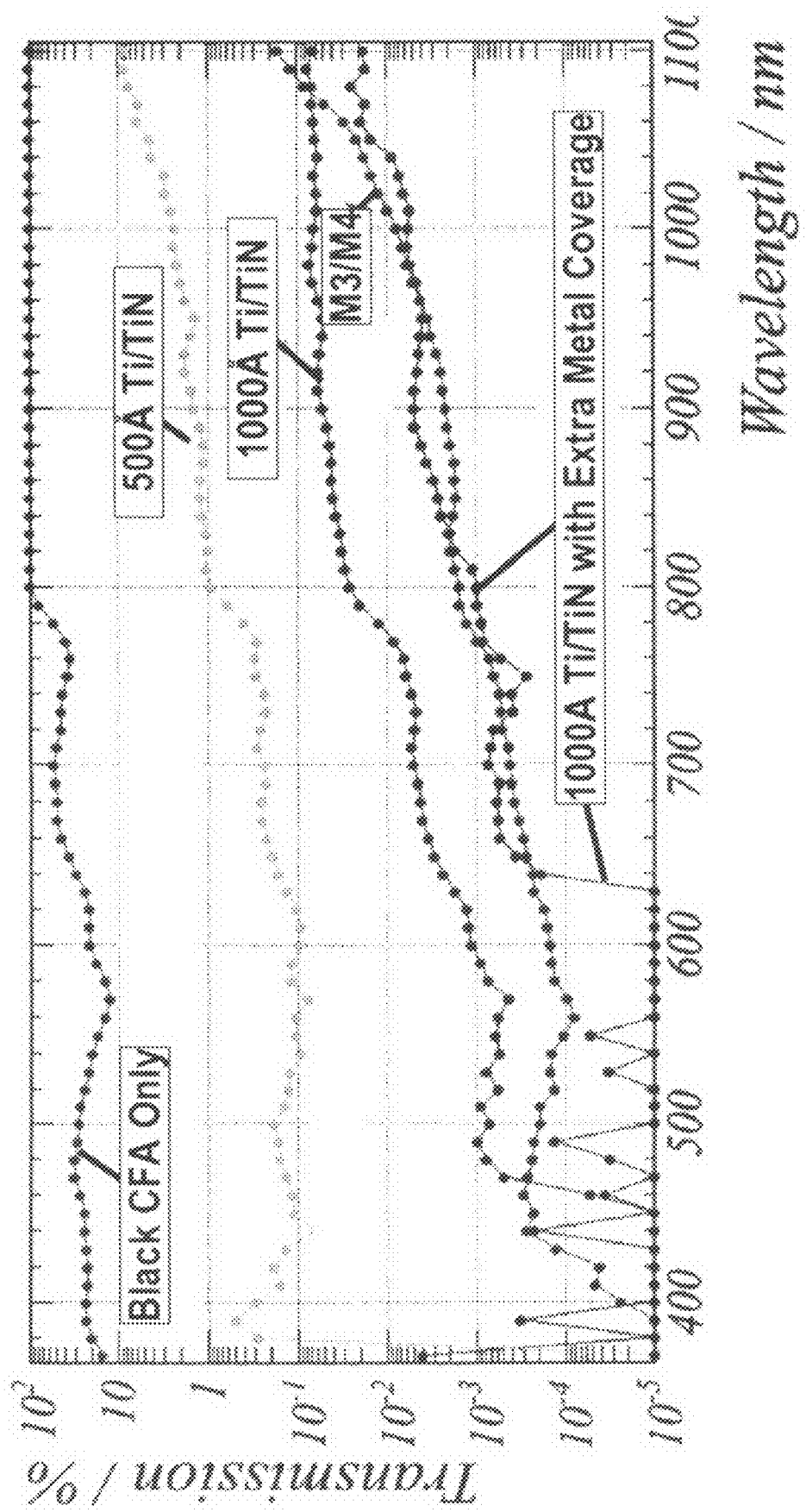
FIG. 4 is a graph of Optical Black pixel spectral response for different OB technologies, including an embodiment of the present invention.

OB pixels implemented using only a Ti/TiN Black mask have opacity that depends on the thickness of the deposited Ti/TiN layer. For instance, FIG. 4 shows measured spectral transmission curves (opacity) for a 500 Å and 1000 Å thick Ti/TiN layer: doubling the thickness roughly improves opacity by 50 to 100 times. Because higher performance cameras require minimum OB transmission, an even thicker Ti/TiN layer may be required. However, further thickening the Ti/TiN layer causes the following challenges to arise:
  (1) High potential for pealing of Ti/TiN layers thicker than 1000 Å
  (2) Increasing photo-resist thickness compromises wafer planarity
  (3) Increasing deposition time for the Ti/TiN layer likely compromises dark current performance.

Hence any of these technological challenges has an adverse effect on clear, OB and dummy pixel performance.

Figure 5:
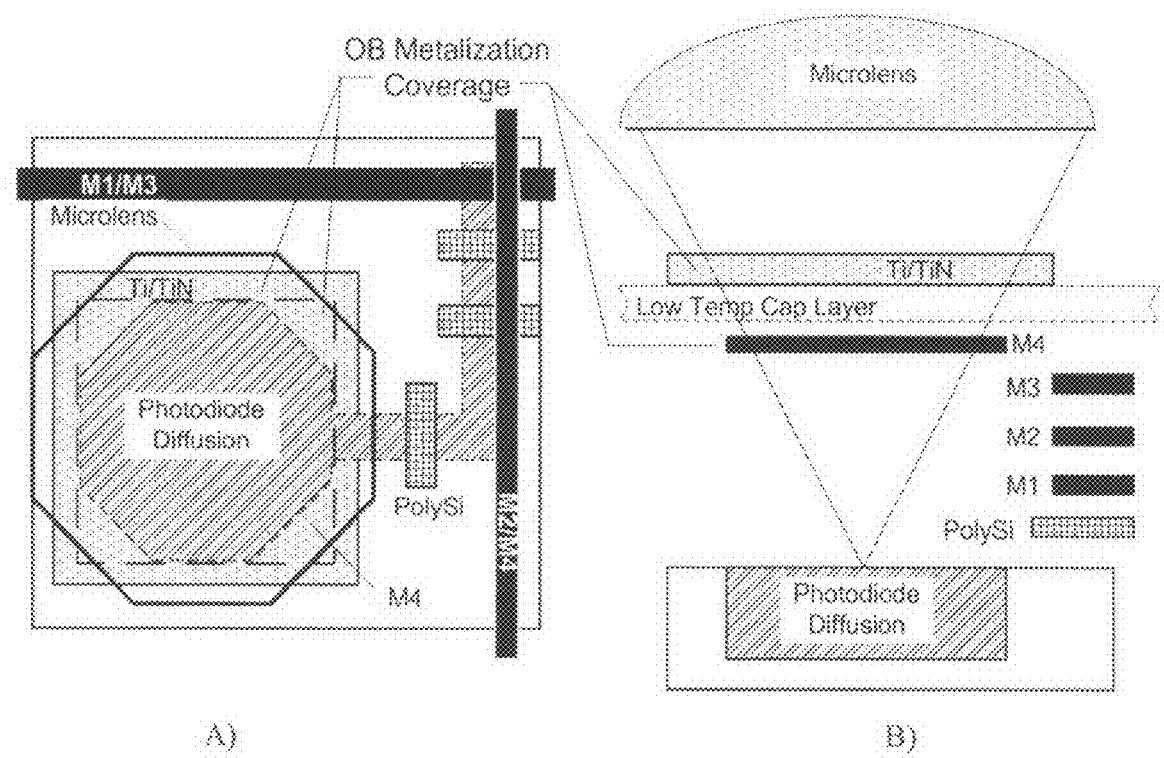
FIG. 5A is a top-view of an embodiment of the OB pixel structure of the present invention.
FIG. 5B is a side-view of an embodiment of the OB pixel structure of the present invention.

According to the present invention, OB opacity is increased without having to increase Ti/TiN layer thickness. A hybrid approach is utilized combining a 1000 Å thick Ti/TiN OB layer in conjunction with in-pixel metallization "tabs" that further occlude the focal radius of each pixel's incoming light beam. As shown in FIGS. 5(A) and 5(B), each OB pixel includes a metal stub formed from an inter-level metal layer (e.g., the top metal layer M4) that is substantially smaller that the actual pixel area. As used herein, the term metal stub means a metal structure that overlays the pixel photodiode, but is smaller than the total area of the pixel. This can be seen in the cross-section view of FIG. 5(B). This added metal occlusion over the photodiode provides further light shielding and boosts the overall OB pixel opacity. However, due to its constrained dimension (i.e., it is much smaller than the full pixel pitch), it does not compromise dark current performance by preventing the various Si-annealing steps to mitigate processing damage at the Si—SiO$_2$ interface. The area of the added metal shape is instead sized such that it effectively captures the light spot focused by the pixel microlens for normal incidence condition. Since the resulting metal stub coverage of OB pixels is relatively sparse, the pixel dark current is allowed to recover to the nominal process design goal after each anneal step.

Measured OB response for the present invention is shown in FIG. 4 (Black Curve): there is a 100× improvement in opacity (in the visible spectrum) relative to the earlier use of a thick Ti/TiN mask. In addition, there is about a 10× improvement in the infrared region of the spectrum. Additional metal layers would increase the opacity in the IR region.

Those skilled in the art will appreciate that various adaptations and modifications of the just-described preferred embodiments can be configured without departing from the scope and spirit of the invention. Therefore, it is to be understood that, within the scope of the appended claims, the invention may be practiced other than as specifically described herein.

What is claimed is:

1. An optical black pixel comprising:
   a photodiode;
   a single metal layer overlaying the photodiode; and
   a single Ti/TiN layer overlaying the single metal layer to increase opacity of the optical black pixel;
   wherein the single metal layer comprises a metal stub formed in a top inter-level metal layer to increase opacity of the optical black pixel, and wherein the metal stub is smaller than a full pixel area.

2. The optical black pixel of claim 1, wherein the pixel further comprises a microlens covering the pixel.

3. The optical black pixel of claim 1, wherein the Ti/TiN layer is approximately 1000 Å thick.

4. The optical black pixel of claim 1, further comprising at least one additional metal stub at a different metal layer to increase opacity in an infrared region.

5. A method of increasing the opacity in an optical black pixel, the method comprising:
   forming a metal stub in a single inter-level metal layer, the metal stub covering an area of a photodiode in the pixel; and
   forming a single Ti/TiN layer above the metal stub;
   wherein the metal stub and the single Ti/TiN layer increase the opacity of an optical black pixel.

6. An image sensor comprising an array of clear pixels, and a plurality of optical black pixels, the optical black pixels comprising:
   a metal stub formed in a single inter-level metal layer, the metal stub covering an area of a photodiode in the pixel; and
   a single Ti/TiN layer formed above the metal stub;
   wherein the metal stub and the single Ti/TiN layer increase the opacity of an optical black pixel.

7. The image sensor of claim 6, wherein the Ti/TiN layer is approximately 1000 Å thick.

* * * * *